United States Patent [19]

Blais

[11] Patent Number: 5,187,364
[45] Date of Patent: Feb. 16, 1993

[54] SCANNING DEVICE WITH WAVEFORM GENERATOR OPTIMIZER

[75] Inventor: Francois Blais, Orleans, Canada

[73] Assignee: National Research Council of Canada/Conseil National de Recherches du Canada, Ottawa, Canada

[21] Appl. No.: 612,578

[22] Filed: Nov. 14, 1990

Related U.S. Application Data

[63] Continuation-in-part of Ser. No. 492,893, Mar. 13, 1990, abandoned.

[30] Foreign Application Priority Data

Mar. 22, 1989 [CA] Canada ................................ 597074

[51] Int. Cl.$^5$ ............................................. H01J 5/16
[52] U.S. Cl. ..................................... 250/236; 359/221
[58] Field of Search ................ 250/236, 235, 230; 350/6.91, 6.6

[56] References Cited

U.S. PATENT DOCUMENTS

| | | | |
|---|---|---|---|
| 3,717,772 | 2/1973 | Engman | 250/235 |
| 4,286,212 | 8/1981 | Staebler et al. | |
| 4,329,011 | 5/1982 | Mori et al. | |
| 4,350,988 | 9/1982 | Masegi | |
| 4,368,489 | 1/1983 | Stemme et al. | |
| 4,638,156 | 1/1987 | Horikawa et al. | 250/235 |
| 4,648,685 | 3/1987 | Fukai et al. | |
| 4,695,722 | 9/1987 | Motooka | 250/235 |
| 4,800,270 | 1/1989 | Blais | |
| 4,800,271 | 1/1989 | Blais | |

OTHER PUBLICATIONS

F. Blais-"High Precision Control of Galvanometer Scanner" vol. 817, pp. 8-16; Spie's 31st Symposium on Optical and Opto-Electronic Science and Engineering, Aug. 16 to 21, 1987 San Diego, U.S.A.
G. F. Marshal, "Laser Beam Scanning:Opto-Mechanical Devices, Systems and Data Storage Optics" published by Marcel Dekker, Inc, 1985, pp. 244-250 (especially section 5.1.2 and FIG. 29.
S. J. Orfanidis, "Optimum Signal Processing:An Introduction" published by MacMilland Publishing Co. 1985, Chapter 7, pp. 404 tp 408.
F. Blais, "Control of Low Inertia Galvanometers for High Precision Laser Scanning Systems" published in Optical Engineering vol. 27 No. 2, 104-110 (Feb. 1988).

Primary Examiner—David C. Nelms
Assistant Examiner—Que T. Le

[57] ABSTRACT

A scanning device has a drive system to angularly reciprocate a rotatable mirror about an axis in a desired waveform in accordance with an excitation signal supplied by a programmable waveform generator. A position sensor generated as signal representing the actual waveform of reciprocation of the mirror, and a microprocessor determines a signal representing the error between the actual waveform and the desired waveform. The microprocessor includes a waveform optimizer that receives this error signal and delivers an excitation correction signal to the waveform generator to adjust the excitation signal from the waveform generator to cause the mirror to have an actual waveform substantially in accordance with the desired waveform.

8 Claims, 6 Drawing Sheets

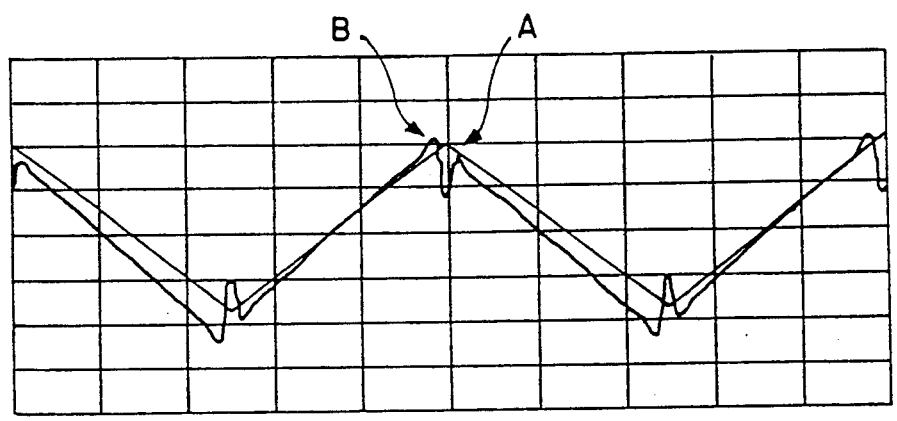
FIG. 4A
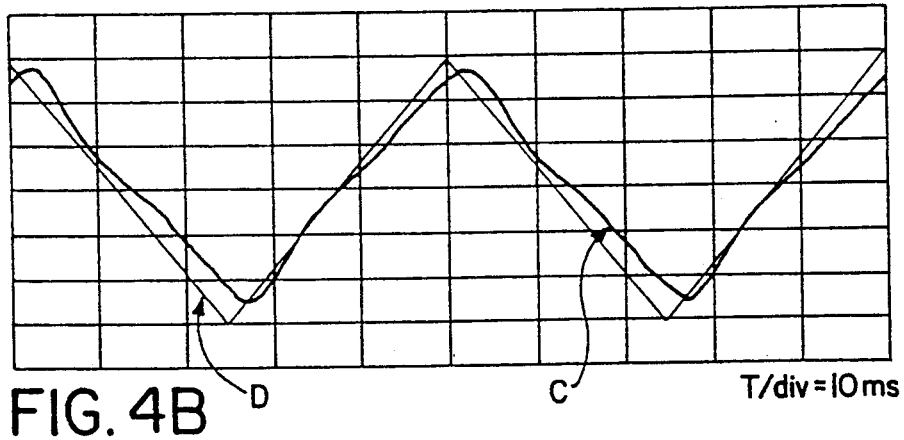
FIG. 4B  T/div=10ms

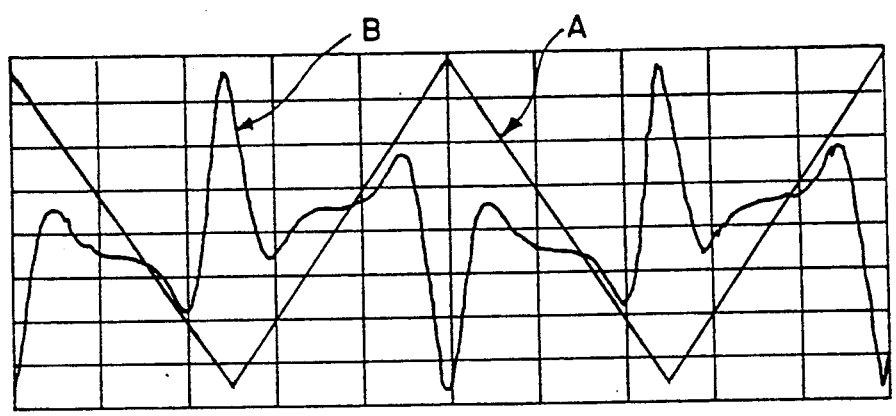
FIG. 5A
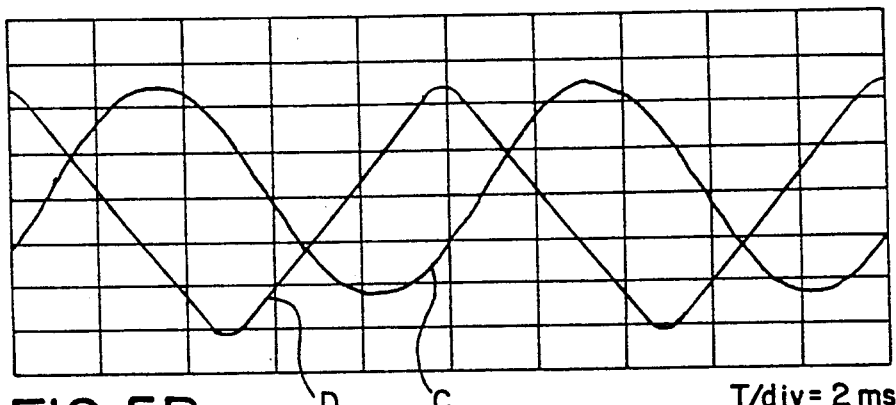
FIG. 5B    T/div = 2 ms

1

SCANNING DEVICE WITH WAVEFORM GENERATOR OPTIMIZER

RELATED APPLICATION

This application is a continuation-in-part of application Ser. No. 07/492,893 filed Mar. 13, 1990 now abandoned.

FIELD OF INVENTION

The present invention is directed to a scanning device with a waveform generator for supplying a drive signal to rotate the scanning mirror of a galvanometer, or similar type of device, in a predetermined pattern. The generator provides a signal with a waveform shape to create a drive signal for the galvanometer which moves the mirror in a predetermined pattern with a high degree of precision.

BACKGROUND OF THE INVENTION

Various types of circuitry have been developed to provide a drive signal to rotate a mirror of a galvanometer to a required position or the mirror of a light scanning apparatus in a predetermined pattern. One type of circuit is shown in U.S. Pat. No. 4,286,212 in which a variable control signal generator is coupled to input terminals of the galvanometer through a current amplifier, the angle of the deflection of the mirror being dependent on the value of the control signal from the generator. However, due to the fact that the galvanometer exhibits hysteresis, the deflection angle also depends to a certain extent on the value of the previously applied control signal. This hysteresis makes it difficult to achieve repeatable random access of any particular discrete angular position of the mirror with great accuracy. In order to counteract this problem, U.S. Pat. No. 4,286,212 provides a system to ensure that the control signal applied to the galvanometer is always returned to a predetermined reference level for a given period of time before it is changed to a new value. Therefore, each new angle to which it is desired to accurately rotate the mirror is referenced from substantially the same reference position to eliminate the effect of hysteresis on the movement of the mirror.

U.S. Pat. No. 4,329,011 discloses a laser printer in which a laser beam is reflected by a galvanometer mirror onto a recording medium. The drive signals are supplied to the drive for the mirror from a drive signal generator through a drive amplifier. The drive signal generator produces a number of different voltages which are applied by electronic switches at particular times in a scanning cycle to the drive amplifier. These then provide a drive signal which will rotate the galvanometer, taking into account the resonant frequency of the galvanometer, in a manner which will scan the laser beam across the recording medium at a high and constant speed.

U.S. Pat. No. 4,368,489 describes a system for scanning frames of motion-picture films including a tilting-mirror scanning mechanism which deflects the projected image of a frame across a row of photodiodes, in a direction perpendicular to the row, periodically at a frequency corresponding to the vertical scanning frequency of a standard television picture. The tilting-mirror mechanism employed is provided with oil-damped action with the damping oil being maintained at a stabilized temperature by a heating device in order to provide a stabilized damping action. The movement of the tilting-mirror in this device is temperature dependent due to temperature effects on the damping action of the oil. Other types of scanning devices also have mechanism whose movements with applied drive signals can vary with changes in temperature. This U.S. Pat. No. 4,368,489 illustrates the type of control signal, as well as circuitry for generating the signal, which will move the tilting-mirror scanning mechanism with the required scanning sweep.

The above-mentioned references serve to illustrate various types of mechanism employing rotatable or scanning mirrors and indicates that the control signals needed for driving these mirrors vary considerably in the shape of their waveform depending on the type of mechanism and required motion. U.S. Pat. Nos. 4,329,011 and 4,368,489 use pre-encoded waveforms to generate the desired scanning motion of their mirrors. These pre-encoded waveforms are fixed for any one particular type of galvanometer. However, it is impossible to perfectly predict the response of any one type of device to a pre-defined excitation. The motion, as a result can fluctuate considerably from one device to another for a particular drive signal waveform and these devices, along with their drive signal waveform, must then be manually adjusted. The characteristics of galvanometers or scanning mirror devices can also change over a period of time due to temperature changes, aging, drifting etc.

U.S. Pat. Nos. 4,329,011 and 4,368,489 provide an angular displacement to their mirrors which is characterized by a, more or less, sawtooth shape, i.e. a linear rotational motion of the mirror in one direction followed by a faster return motion. However, other types of rotational motion of galvanometers mirrors exist such as sinusoidal rate of movement. Due to the inertia of the moving mirror and friction in the system, the voltage waveform required to move the mirror in a particular manner will not correspond to the waveform of the actual angular displacement of the mirror. This is clearly illustrated in U.S. Pat. No. 4,648,685 which show diagrams of the waveforms of voltages applied to drive a galvanometer mirror and the responsive angular displacements of the galvanometer mirror in the same figures.

U.S. Pat. No. 4,350,988 shows a system for scanning a laser beam across a recording medium by moving a mirror which is driven by a motor so that the angular displacement of the mirror has a sinusoidal form. A photodetector with a mask having two parallel slits is positioned so that the laser beam is reflected towards the detector when it is near one end of its scan. The detector then provides two pulses and from these, by measuring the pulse interval, the scanning velocity at that position can be determined. A signal proportional to the detected velocity and a signal from a reference signal generator are applied to a comparison circuit which provides an output signal (error signal) to adjust the speed of the motor and control the velocity of the beam as it scans the recording medium.

SUMMARY OF THE INVENTION

It is an object of the present invention to provide a scanning device with a drive system to angularly reciprocate a rotatable element, e.g. the mirror of a galvanometer, in a desired waveform.

A preferred embodiment of the invention comprises a scanning device having a drive system to angularly reciprocate a rotatable element about an axis in a desired waveform, reference means defining said desired waveform, a programmable waveform generator for supplying an excitation signal to the drive system in accordance with said desired waveform, a position sensor for generating a signal representing the actual waveform of reciprocation of the rotatable element, and a microprocessor having (a) means for determining an actual error signal representing an error between the actual waveform as determined by the position sensor and the desired waveform as determined by the reference means, (b) means for generating a model of the scanning device for generating an attempted error signal, and (c) a waveform optimizer for receiving said actual error signal and comprising means for obtaining a difference between the attempted error signal and the actual error signal to generate a signal representing an imperfection in the actual error signal, means receiving said imperfection signal for generating an estimate of the excitation error and for delivering an excitation correction signal to the waveform generator to adjust the excitation signal from the waveform generator to cause the rotatable element to have an actual waveform substantially in accordance with the desired waveform.

Because almost any type of waveform can be programmed and optimized by the present invention, many types of applications can be found for the device, such as 3D sensors, laser printers, photo typesetting, etc.

BRIEF DESCRIPTION OF THE DRAWINGS

FIGS. 4A, 4B, 4C, 4D, 5A and 5B show experimental results obtained with the embodiment of FIGS. 1 and 2, FIG. 4A being a graph showing an optimized excitation waveform together with a standard excitation waveform each division of the graph (T/div.) representing a time of 10 ms, FIG. 4B being a graph showing the response of a galvanometer to the optimized and standard excitation waveforms shown in FIG. 4A, and FIGS. 4C and 4D showing related signals during the optimization process; with FIGS. 5A and 5B corresponding to FIGS. 4A and 4B but in a case in which each division of the graph (T/div.) represents a time of 2 ms.

DESCRIPTION OF THE PREFERRED EMBODIMENTS

Figure 1:
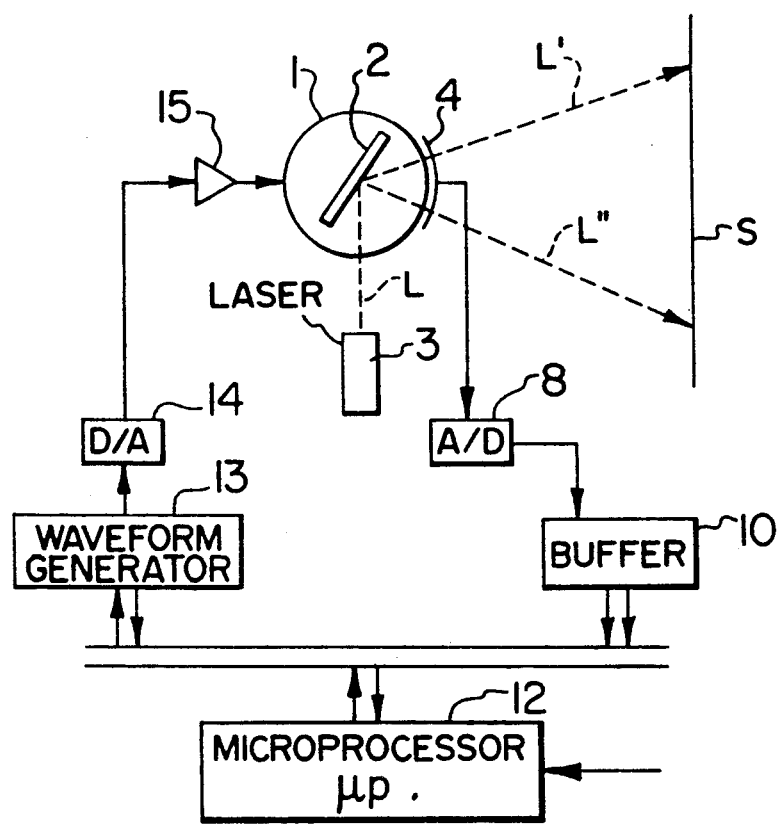
FIG. 1 shows a schematic diagram of a circuit for a scanning device according to an embodiment of the present invention.

Referring to FIG. 1, a galvanometer 1 is driven by signals from a programmable waveform generator 13, which are applied through a digital-to-analog converter 14 and a current amplifier 15. The output of the current amplifier 15 is applied to drive coils for a mirror 2 of the galvanometer 1. The drive coils angularly reciprocate the mirror 2 about an axis, whereby to deflect a laser beam L from a laser 3 so that this beam scans a surface S between limits L' and L". The galvanometer 1 has a built-in position sensor 4 which detects the angular position of the mirror 2. Such built-in position sensors are standard in the art. See, for example the book "Laser Beam Scanning: Opto-Mechanical Devices, Systems, and Data Storage Optics" by Gerald F. Marshall, published by Marcel Dekker, Inc. 1985 pp 244-250, especially section 5.1.2 and FIG. 29 where a capacitive built-in position sensor is shown just above the lower ball bearing.

The signal from the position sensor 4 is applied to an analog-to-digital converter 8 whose output is applied through a buffer 10 to a microprocessor 12. The position and movement of the mirror 2 is determined by the microprocessor 12 from the signal supplied by the A/D converter 8. The actual movement (response) of the mirror 2 is thus compared with the desired response programmed in the microprocessor 12. The microprocessor 12 can thus determine errors between the actual response and the desired response to generate correction signals that need to be applied to the waveform generator 13 in order to adjust the excitation applied to the drive coils of the galvanometer 1 to cause the actual response of the mirror to correspond closely to the desired response. A clock generator (not shown) supplies clock signals to the buffer 10, the microprocessor 12 and the generator 13.

Figure 2:
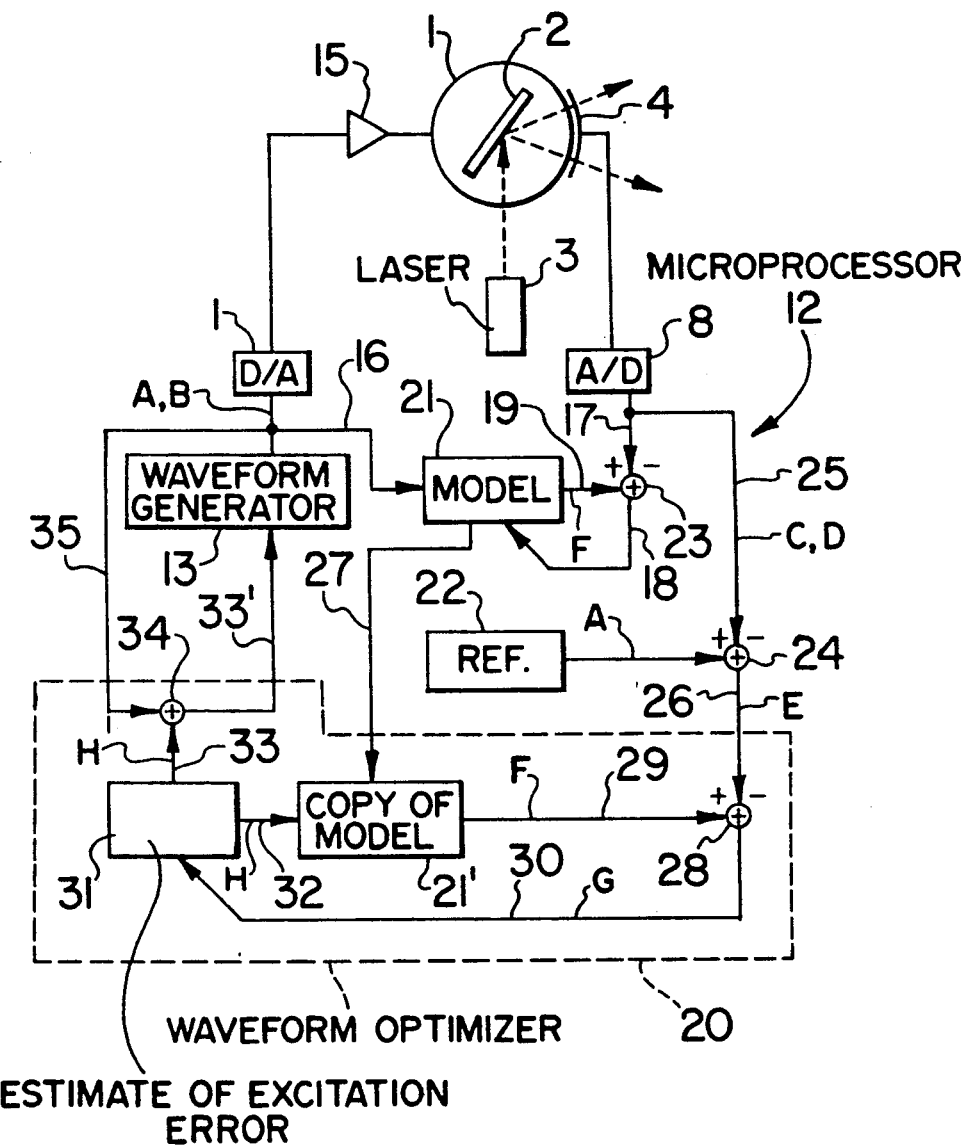
FIG. 2 is a more detailed circuit diagram that illustrates the function of the system shown in FIG. 1.

FIG. 2 illustrates the system in more detail and its function. A model 21 of the galvanometer 1 is automatically built by the microprocessor 12. This model 21 receives the excitation signal from the waveform generator 13 on line 16 and emits an "attempted" or "model" error signal on line 19. The difference between this attempted error signal and the actual waveform on line 17 is determined by an adder 23 and fed back to the model 21 on line 18 to constantly update it. The feedback on line 18 thus serves to adjust the model 21 as conditions in the galvanometer, such as temperature, vary. The model 21 could, for example, be an Adaptive Wiener Filter, such as described in Chapter 7, especially pages 404 to 408, of the book "Optimum Signal Processing: An Introduction" by S. J. Orfanidis, MacMillan Publishing Co. 1985.

Figure 4C:
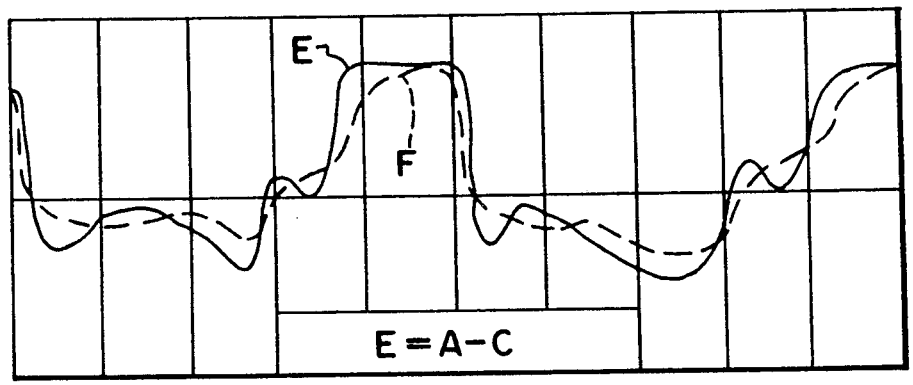

As more fully explained below, the model 21 is used to evaluate the excitation correction signal required to be applied to modify the excitation waveform to compensate for the errors between the desired response and the actual response of the mirror 2. The desired response (waveform A in FIG. 4A) is determined by a reference 22 and is subtracted from the actual response (waveform C in FIG. 4B) on line 25 by an adder 24, to determine the actual error signal E (FIG. 4C). This error signal E is applied on line 26 to a waveform optimizer 20 which includes a second model 21' that is a copy of the computer constructed model 21, by which it is kept constantly updated by signals on line 27. The optimizer 20 also includes an adder 28 that receives the actual error signal E on line 26, and, by subtracting such signal from the attempted error signal F (FIG. 4C) received from the model copy 21' on line 29, generates on line 30 a signal G that represents the imperfection in the actual error signal. This latter signal G is applied to a further model 31 that generates an estimate of the excitation error. An excitation correction signal H from the model 31 is sent on line 32 to the model copy 21'. Because only this excitation error signal H is applied to the model 21', the response obtained in signal F should be equal to the actual error signal of the galvanometer obtained in signal E. The difference (or imperfection signal G) between this attempted error signal F and the actual error signal E is used to modify the estimate of the excitation error 31, so that signals E and F will be approximately equal to each other. The estimate of the excitation error (excitation correction signal H) is applied on lines 33 and 33' to the waveform generator 13. To avoid instability in the system the line 33 passes through an accumulator 34 that also receives feedback on line 35 from the output of the waveform generator 13. This arrangement adjusts the output of the waveform generator 13 in steps, causing the system to take a few seconds to start up, but responding rapidly and accurately after this start up time.

Hence, to summarise, the waveform optimizer 20 applies the excitation correction signal H to the programmable waveform generator 13.

FIG. 4A shows in waveform A a standard triangular excitation waveform, in this case the desired excitation waveform, while FIG. 4B shows by waveform C the actual response of the galvanometer to this standard excitation waveform A. In other words, when the signal on line 16 is A, the signal on line 25 is C. The drawing shows that the waveform C is distorted from the ideal triangular shape A. In order to provide a scan of the mirror 2 that more closely follows the desired triangular waveform A, the microprocessor 12 thus employs the circuit shown in FIG. 2 to modify the output from the waveform generator 13 until the desired waveform A is attained or more nearly attained. The waveform from the generator 13 that is required to achieve this result is shown by the waveform B in FIG. 4A, and the waveform D in FIG. 4B shows the response of the galvanometer to the input excitation signal B. As can be seen, the waveform D is substantially identical to the desired waveform A, being much closer thereto than the waveform C was, whereas the necessary excitation waveform B is substantially different from the initial excitation waveform A, especially in the regions of the peaks of the curve.

Figure 4D:
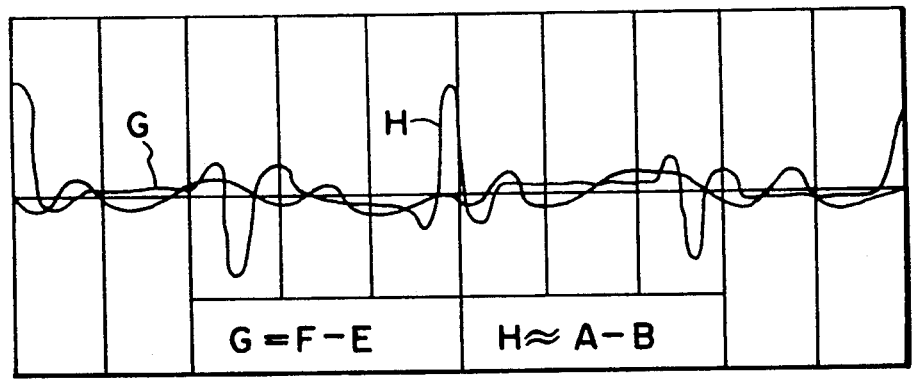

Thus, by the end of the optimization process the system tries to obtain a waveform D identical to the waveform A. Therefore E=A−D will become almost 0, which means that the estimate of the excitation error will also be almost 0 and consequently F and G will be almost 0. At the end of the optimization process E, F, G and H are all close to zero. The curves for signals E, F, G and H that are shown in FIGS. 4C and 4D are thus only valid at the beginning of the optimization process i.e. when E=A−C rather than A−D.

The time per division in FIG. 4 is 10 ms, whereas in FIG. 5 the time per division is 2 ms. In other words, the scanning rate in FIG. 5 is five times faster than in FIG. 4, i.e. 100 Hz, the resonant frequency of the galvanometer being 70 Hz. In the case of FIG. 5B, the galvanometer response C to the standard triangular excitation A has deteriorated into a sinusoidal shape. However, the microprocessor 12 adjusts the output of the waveform generator 13 to provide an excitation signal B as shown in FIG. 5A. Although the waveform B differs radically from the desired scanning response A, it nevertheless results in the actual response of the galvanometer having the waveform D shown in FIG. 5B which is a close approximation to the desired scanning response A. With this system for supplying an optimized excitation drive signal, the scanning speed can be increased while the accuracy of the actual response is substantially maintained.

Errors in the motion of the mirror, other than those due to inertia, are caused by minute differentials of force operating on its suspension system and combinations of magnetomechanical and electronic driver system imbalances that can vary over a period of time due to temperature changes, aging, drifts of the electronic components, electrical noise, hysteresis, dust contamination, etc. Position sensors, such as the sensor 4 shown in FIG. 1, are conventionally incorporated into galvanometer scanners, but their precision is limited by the nonlinearity of the position sensor and by temperature drifts. These will affect both the null position and the gain of the transducer and, subsequently, the position of the scan angle. To compensate for these last-mentioned errors, the galvanometer may also include a photodetector system such as described in applicant's U.S. Pat. Nos. 4,800,270 and 4,800,271 both issued Jan. 24, 1989. Additional explanation of this latter system is provided in "Control of Low Inertia Galvanometers for High Precision Laser Scanning Systems" by F. Blais, published in Optical Engineering Vol 27 No. 2, 104–110 (February 1988). This photodetector system intercepts at least a portion of the light beam during its scan and provides synchronizing pulses which are applied to the microprocessor to more accurately determine the actual reciprocating motion of the mirror.

In one of the specific systems described in the last-mentioned patents, two closely spaced photodetectors are positioned at a location to intercept the beam where the beam has a large enough cross-section to encompass more than one photodetector. The beam position is measured by comparing the amplitudes of the two detected signals as the laser beam scans the two closely spaced photodetectors, the zero crossing when the center of the laser beam is at the midpoint of the two detectors being determined by a comparator. These two photodetectors can be part of an array of many photodetectors mounted on a single substrate.

Figure 3:
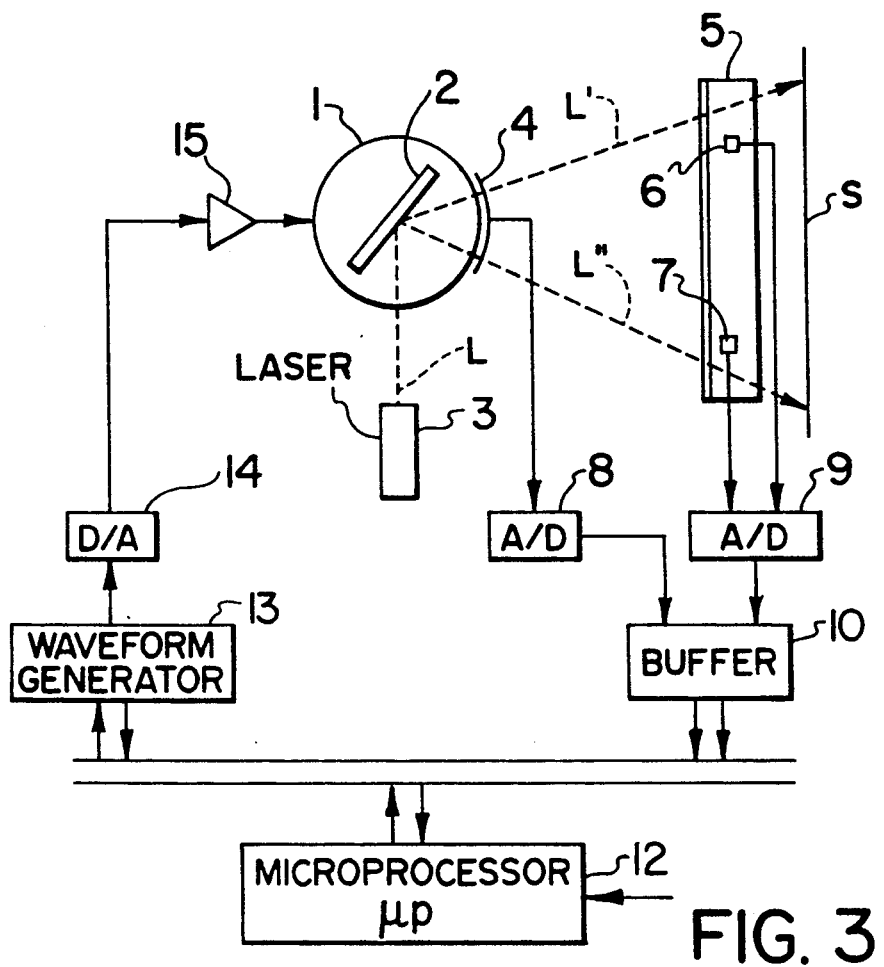
FIG. 3 is a schematic diagram of a further scanning device according to a second embodiment.
Figure 3A:
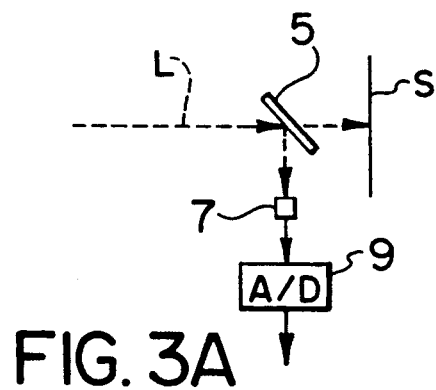
FIG. 3A shows a side view of a window and photocell arrangement in the embodiment shown in FIG. 3.

In another of the specific systems described in the last-mentioned patents, the galvanometer can include an inclined window with two spaced photodetectors located below the window. This type of system places the photodetectors out of the path of the light beam and is shown in FIG. 3 and 3A as an addition to the system shown in FIGS. 1 and 2. The laser beam L reflected from the mirror 2 traverses a window 5 before it scans the surface S, the window being inclined at an angle as shown in FIG. 3A so that a portion of the laser beam is reflected downwards in the direction of two spaced photodetectors 6 and 7. In FIG. 3A, the photodetector 6 is not seen because it is located behind the photodetector 7. A portion of the laser beam reflected by the window 5 intercepts the photodetectors 6 and 7 as the beam scans the surface S between the positions indicated by L' and L" in FIG. 3.

The photodetector 6 is positioned so that a portion of the laser beam reflected from the window 5 will intercept this detector near one end of its scan (L'), while the photodetector 7 is positioned so that a portion of the laser beam will intercept the detector 7 near the other end of its scan (L"). As a result, the photodetector 6 will produce a pulse at a time $t_1$, as the laser beam swings towards one end (L'), and another pulse at a time $t_2$, as the laser beam returns to swing towards the other end (L"). Similarly, photodetector 7 will produce a pulse at a time $t_3$, as the laser beam swings towards the other end (L"), and a further pulse at a time $t_4$, as the laser beam reverses its scan direction and moves towards said one end (L').

Assuming that the galvanometer is driven by a sinusoidal or triangular type of waveform from the generator 13 (see FIGS. 4 and 5), the signals at times $t_1$ to $t_4$ are correction signals that can be used to determine errors in the scan such as "$E_{offset}$" where the laser beam swings further at one end of the scan than at the other end, and "$E_{gain}$" when the laser beam reflected from mirror 2 swings past the positions indicated by L' and L" or does not swing far enough to reach these positions. Another variable that can be determined from the signals at times $t_1$ to $t_4$ is the phase shift between the actual scanning motion and the excitation signal waveform for a sinusoidal drive signal or other simple waveforms. The peak of one end portion of the laser scan will be at ½ the period between times $t_1$ and $t_2$, and the peak at the other end of the scan will be ½ the period between times $t_3$ and $t_4$. These features have been described in more detail in the Optical Engineering article referred to above and also in Optomechanical Systems Engineering "High precision control of galvanometer scanner" by F. Blais, Vol. 817, p. 8–16; SPIE'S 31st Symposium On Optical and OptoElectronic Science and Engineering, Aug. 16 to 21, 1987, San Diego, U.S.A.

In the embodiment shown in FIGS. 3 and 3A, the correction signals at times $t_1$ to $t_4$ are also applied to the microprocessor 12 through the buffer 10 after being converted into digital form by an A/D converter 9. The microprocessor 12 uses the combination of the signals from the A/D converters 8 and 9 not only to achieve the improvements demonstrated in FIGS. 4 and 5, but simultaneously to determine the actual position and movement of the scanning laser beam more accurately. It will be appreciated that there is no conflict between the two sets of correction signals. The function of the waveform optimizer 20 in the microprocessor 12 in FIG. 3 remains the same as has been described above in connection with FIG. 2 and relates essentially to shaping the excitation waveform to achieve the desired response. The correction signals from the A/D converter 9 are not concerned with waveform shape, but act to instruct the system to correctly control the amplitude, center point and phase of the oscillation of the mirror 2.

I claim:

1. A scanning device having a drive system to angularly reciprocate a rotatable element about an axis in a desired waveform, reference means defining said desired waveform, a programmable waveform generator for supplying an excitation signal to the drive system in accordance with said desired waveform, a position sensor for generating a signal representing the actual waveform of reciprocation of the rotatable element, and a microprocessor having
    (a) means for determining an actual error signal representing an error between the actual waveform as determined by the position sensor and the desired waveform as determined by the reference means,
    (b) means for generating a model of the scanning device for generating an attempted error signal, and
    (c) a waveform optimizer for receiving said actual error signal and for delivering an excitation correction signal to the waveform generator to adjust the excitation signal from the waveform generator to cause the rotatable element to have an actual waveform substantially in accordance with the desired waveform.

2. A scanning device having a drive system to angularly reciprocate a rotatable element about an axis in a desired waveform, reference means defining said desired waveform, a programmable waveform generator for supplying an excitation signal to the drive system in accordance with said desired waveform, a position sensor for generating a signal representing the actual waveform of reciprocation of the rotatable element, and a microprocessor having
    (a) means for determining an actual error signal representing an error between the actual waveform as determined by the position sensor and the desired waveform as determined by the reference means,
    (b) means for generating a model of the scanning device for generating an attempted error signal, and
    (c) a waveform optimizer for receiving said actual error signal and comprising means for obtaining a difference between the attempted error signal and the actual error signal to generate a signal representing an imperfection in the actual error signal, means receiving said imperfection signal for generating an estimate of the excitation error and for delivering an excitation correction signal to the waveform generator to adjust the excitation signal from the waveform generator to cause the rotatable element to have an actual waveform substantially in accordance with the desired waveform.

3. A scanning device as defined in claim 2, wherein the light beam is a coherent light beam.

4. A scanning device as defined in claim 2, wherein the rotatable element is a scanning mirror that is angularly reciprocable between two maximum positions.

5. A scanning device as defined in claim 4, including at least one photodetector located so that at least a portion of a light beam reflected by the mirror intercepts the photodetector as the mirror is reciprocated between its two maximum positions, signals from the photodetector being applied to the microprocessor to more accurately determine the position and motion of the mirror.

6. A scanning device as defined in claim 4, wherein said at least one photodetector consists of two closely spaced photodetectors so positioned that at least a portion of a light beam reflected by the mirror intercepts these photodetectors as the mirror rotates through a portion between the maximum positions.

7. A scanning device as defined in claim 4, wherein said at least one photodetector consists of two spaced photodetectors so positioned that at least a portion of a light beam reflected by the mirror intercepts a respective one of the photodetectors as the mirror nears its respective maximum positions.

8. A scanning device as defined in claim 3, wherein the waveform generator provides a digital output that is applied to a digital-to-analog converter whose output is applied through a current amplifier to the drive system for angularly reciprocating the mirror.

* * * * *